United States Patent [19]

Neilson

[11] 4,398,206
[45] Aug. 9, 1983

[54] TRANSISTOR WITH INTEGRATED DIODE AND RESISTOR

[75] Inventor: John M. S. Neilson, Mountaintop, Pa.

[73] Assignee: RCA Corporation, New York, N.Y.

[21] Appl. No.: 233,488

[22] Filed: Feb. 11, 1981

[51] Int. Cl.³ .............................................. H01L 27/02
[52] U.S. Cl. ........................................ 357/46; 357/48; 357/51
[58] Field of Search ........................ 357/51, 46, 48, 36

[56] References Cited

U.S. PATENT DOCUMENTS

| 3,230,429 | 1/1966 | Stehney | 357/51 |
| 3,909,837 | 9/1975 | Kronlage | 357/15 |
| 3,936,863 | 2/1976 | Olmstead | 357/51 |
| 4,017,882 | 4/1977 | Kannam et al. | 357/13 |
| 4,071,852 | 1/1978 | Kannam | 357/13 |

*Primary Examiner*—James W. Davie
*Attorney, Agent, or Firm*—Birgit E. Morris; Donald S. Cohen; Robert P. Seitter

[57] ABSTRACT

A semiconductor device including a transistor, diode and resistor comprises a body of semiconductor material formed with conventional emitter, base and collector regions. The collector region forms one electrode of the diode with the other electrode being formed in the region forming the base of the transistor and being separated from the base by an isolation ring. The contact between the emitter and the other electrode are integral, but are insulated from the isolation ring.

4 Claims, 3 Drawing Figures

TRANSISTOR WITH INTEGRATED DIODE AND RESISTOR

BACKGROUND OF THE INVENTION

This invention relates to semiconductor devices and, more particularly, to semiconductor devices including an integrated transistor, diode, and resistor.

In many applications it is usual to provide a diode across the collector and emitter of a transistor. For example, such a diode can provide over voltage protection for the transistor or can be used to carry the negative portion of load current in an inverter type application. With an NPN transistor, the rectifier anode is connected to the transistor emitter and the cathode is connected to the transistor collector; with a PNP transistor, the rectifier anode is connected to the transistor collector and the rectifier cathode is connected to the transistor emitter.

With high voltage switching transistors where fast turn off time is important, prior art transistors with integral diodes have not been entirely satisfactory. In one such device, one of the rectifier's electrodes is located in the center of the device and is integral with material forming the transistor base. This electrode is surrounded by a band of material integral with and forming part of the transistor emitter and the emitter contact extends across the band to the rectifier electrode. With this arrangement, a direct ohmic path is provided from the emitter contact to the base contact adjacent the band, that is, in the material forming the base and the electrode. The resistance of the path insures that the emitter is not inadvertently turned on by low base signals.

Because the band is part of the emitter it injects current when the transistor is on. When the transistor is turned off, the stored charge under the emitter flows laterally to the base electrode as part of the reverse base current flow. The width of the band adds to the lateral distance that must be traversed by the stored charge which in turn adds to the turn off time. Attempts to reduce the width of the band and, thus, the turn off time of the transistor have resulted in a relatively low resistance of the ohmic path between the emitter and base contacts whereby an excessively high base signal is required to turn on the transistor.

SUMMARY OF THE INVENTION

This invention provides a semiconductor device including a transistor, a diode, and a resistor wherein the turn off time of the transistor is relatively fast and the resistance value of the resistor can be maintained as high as desired. The device comprises a body of semiconductor material having first and second generally parallel surfaces. Extending into the body from the first surface is a first region of material of one conductivity type and from the second surface thereof a second region of material of the opposite conductivity type. Extending into the first region is an emitter of the opposite conductivity type forming with the first region a first PN junction, the first and second regions forming a second PN junction. Isolation means is provided and extends into the first region from the first surface and terminates in that region adjacent the second PN junction, whereby, the first region is separated into a base portion cooperating with the emitter and the second region to form a transistor and into an electrode portion cooperating with the second region to form a diode. The base portion and the electrode portion are ohmically connected through the first region adjacent the isolation means.

Preferably, the isolation means comprises a ring of material of the opposite conductivity type extending into the first region. The material inside the ring is the electrode portion and the material outside the ring is the base portion.

The contacts provided for the collector and base portion are generally conventional. The contacts provided for the electrode portion and the emitter are interconnected with the interconnecting portion overlying and being insulated from the isolation means.

BRIEF DESCRIPTION OF THE DRAWING

For a better understanding of the invention, reference is made to the following description of a preferred embodiment thereof, taken in conjunction with the figures of the accompanying drawing, in which:

FIG. 3 is a sectional view taken along the line 3—3 of

DETAILED DESCRIPTION OF A PREFERRED EMBODIMENT

Figure 1:
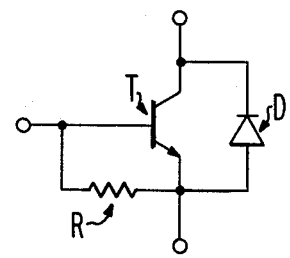
FIG. 1 is a schematic diagram of a circuit formed in a semiconductor device in accordance with this invention.

Referring to FIG. 1, the schematic diagram illustrates an NPN transistor T having a diode D across the emitter and collector terminals and a resistor R across the base and emitter terminals. The anode of the diode is connected to the emitter terminal and the cathode is connected to the collector terminal. It should be understood that the transistor T could be a PNP device in which case the cathode of the diode is connected to the emitter and the anode to the collector. In use, operation of the transistor is generally conventional it being noted that the resistor R prevents the transistor from being turned on by operating as a shunt for relatively low base signals. Current can flow through the diode rather than the transistor upon certain conditions depending upon the exact design and use of the device. For example, if the diode is an avalanche diode having a lower breakdown voltage than the reverse breakdown voltage of the transistor it protects the transistor against reverse breakdown; or, the diode could carry the negative portion of a signal in an inverter circuit.

Figure 2:
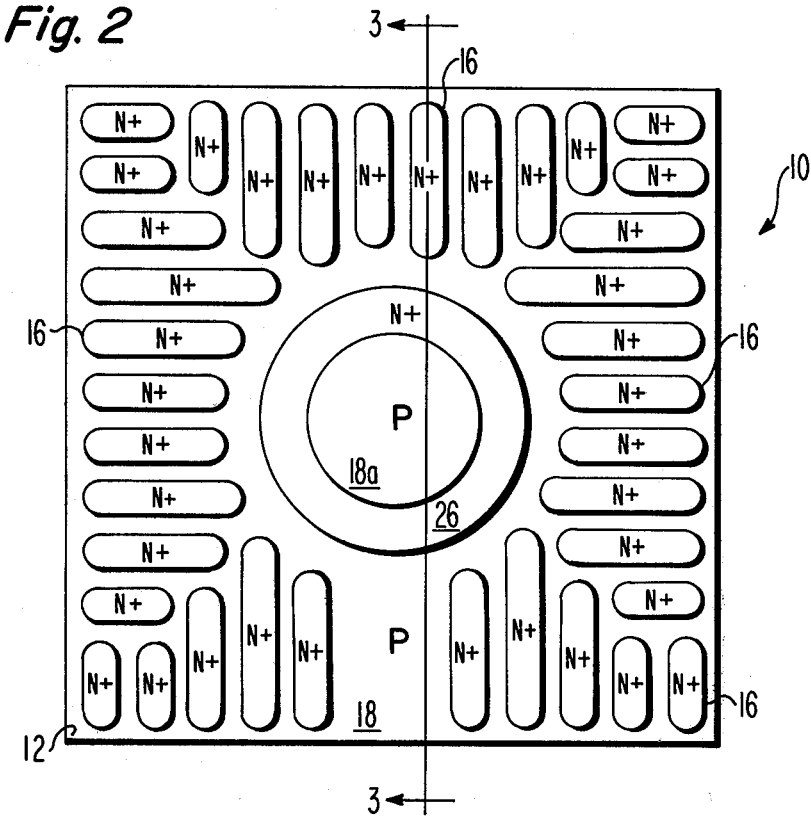
FIG. 2 is a top plan view of a semiconductor device in accordance with this invention.
Figure 3:
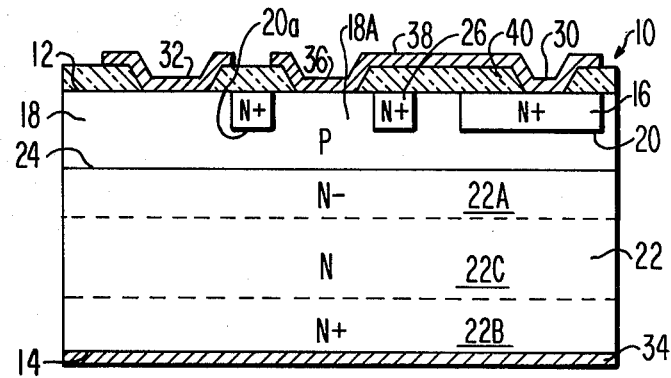

Referring now to FIGS. 2 and 3 there is illustrated a semiconductor device formed with the circuit illustrated in FIG. 1. Included is a body 10 of semiconductor material, for example, silicon, having a first surface 12 and a second generally parallel surface 14. A first region 18 of material of one conductivity type, in this embodiment, P type, extends inwardly from the first surface 12. The body also includes a plurality of emitter stripes 16 that extend inwardly from the surface 12 of the body. The emitter stripes 16 each comprise regions of semiconductor material heavily doped with impurity atoms of the opposite conductivity type, in this embodiment, N type. Because of the heavy doping, the emitter stripes 16 will be referred to as N+ type in accordance with generally conventional terminology. The region 18 of P type material forms PN junctions 20 with the various emitter stipes 14 and as will be made clear hereinafter, these junctions 20 are the emitter-base junctions of the transistor T.

Extending inwardly from the second surface 14 is a second region 22 of semiconductor material doped with impurity atoms of the opposite conductivity type, that is, N type. This layer 22 forms a second PN junction 24 with the layer 18 that functions, as will be made clear hereinafter, as the base-collector junction of the transistor T and also as the rectifying junction of the diode D. Thus, the region 22 forms the collector of the transistor T and the cathode of the diode D. The region 22 is formed with a lightly doped or N− portion 22a adjacent the region 18, a heavily doped or N+ portion 22b extending inwardly from the second surface 14 and a moderately doped portion 22c sandwiched in between to provide a conventional buffered collector.

The anode of the diode D is centrally located on the body 10 and comprises a central portion 18a of the P region 18. The central or anode portion 18a of the P layer is surrounded by a narrow N type isolation ring 26 so that the portion of the P region outside the ring includes the junctions 20 and is the base portion of the transistor 7. The isolation ring 26 is an annular band of heavily doped N+ material that is separated from the emitter stripes 16 by P type material of the region 18. The isolation ring 26, while illustrated as annular, may have any closed configuration in plan view, and it extends to a depth less than that of the P region 18, preferably, to the depth of the emitter stripes 16, so that it terminates at a junction 20a adjacent to and spaced from the junction 24. Between the junctions 20a and 24 there is a channel portion of the P type material connecting the base portion of the layer 18 with the anode portion 18a. This channel portion functions as the resistor R illustrated in FIG. 1 of the drawing.

Completing the description of the device, there are provided suitable contacts or terminals and oxide layers. For the sake of clarity, these are illustrated in FIG. 3 of the drawing only. Referring to that figure, there can be seen emitter stripe contact 30, base contact 32, and collector contact 34. Also provided is a rectifier anode contact 36, it being understood that the rectifier cathode contact is the collector contact 34. It should be equally understood that the various contacts can be provided in accordance with generally conventional metallizing techniques. Still referring to FIG. 3 of the drawing, it can be seen that the emitter contact 30 and the rectifier anode contact 36 are in fact integral being connected by a web portion 38. The web portion 38 overlies the isolation ring 26, but is insulated therefrom by a suitable oxide layer 40. Thus, during operation of the transistor, the isolation ring 26 does not inject electrons into the base as is the case with devices where an emitter portion surrounds the rectifier electrode. Thus, the turn off time of the transistor is decreased relative to those structures.

Moreover, it should be understood that the resistance of the resistor R, that is, the resistance of the channel portion between the junctions 20a, and 24 can be varied without regard to emitter design considerations. This assures that the resistor has a suitable value dependent on its intended purpose.

The device disclosed in FIGS. 2 and 3 can be made by generally conventional techniques. For example, a wafer of N type material can be a substrate on which is desposited and diffused the P type layer and then the N type emitter and isolation ring. If the transistor is a PNP type, all of the conductivity types disclosed above would be reversed.

While in the foregoing there has been described a preferred embodiment of the invention, it should be obvious to those skilled in the art that various changes and modifications can be made without departing from the true spirit and scope of the invention as recited in the appended claims.

I claim:

1. A semiconductor device including a transistor, a diode and a resistor, said device comprising (a) a body of semiconductor material having first and second surfaces generally parallel to each other, (b) a first region of one conductivity type material extending into said body from said first surface and a second region of opposite conductivity type material extending into said body from said second surface, (c) an emitter region of said opposite type conductivity material extending into said first region from said first surface and forming a first PN junction therewith, said first and second regions forming a second PN junction, and (d) an isolation region of said opposite conductivity type material extending into said first region from said first surface and forming a third PN junction with said first region, whereby said first region is separated into (1) a base portion cooperating with said emitter region and said second region to form a transistor and (2) an electrode portion cooperating with said second region to form a diode, said base portion and said electrode portion being ohmically connected by a portion of the first region disposed between the second PN junction and third PN junction.

2. A semiconductor device in accordance with claim 1 wherein said isolation region defines a closed configuration in said one surface and wherein said base portion is outside said configuration and said electrode portion is inside said configuration.

3. A semiconductor device in accordance with claim 1 including contact means for said emitter region, contact means for said base portion, contact means for said second region and contact means for said electrode portion, said emitter contact means and said electrode portion contact means being ohmically connected by a web portion, said web portion overlying said isolation region and being insulated therefrom.

4. A semiconductor device in accordance with claim 1 wherein said isolation region comprises a ring of material, said base portion being located outside said ring and said electrode portion being located inside said ring, contact means for said emitter region, contact means for said base portion, contact means for said second region and contact means for said electrode portion, said emitter contact means and said electrode portion contact region being interconnected with the interconnecting portion thereof overlying and being insulated from the isolation means.

* * * * *